United States Patent
Ichihashi

(10) Patent No.: US 11,014,395 B2
(45) Date of Patent: May 25, 2021

(54) PHOTOSENSITIVE RESIN CONSTITUENT FOR FLEXOGRAPHIC PRINTING PLATE AND FLEXOGRAPHIC PRINTING PLATE

(71) Applicant: ASAHI KASEI KABUSHIKI KAISHA, Tokyo (JP)

(72) Inventor: Ryo Ichihashi, Tokyo (JP)

(73) Assignee: ASAHI KASEI KABUSHIKI KAISHA, Chiyoda-Ku (JP)

( * ) Notice: Subject to any disclaimer, the term of this patent is extended or adjusted under 35 U.S.C. 154(b) by 208 days.

(21) Appl. No.: 16/089,849

(22) PCT Filed: Mar. 28, 2017

(86) PCT No.: PCT/JP2017/012693
§ 371 (c)(1),
(2) Date: Sep. 28, 2018

(87) PCT Pub. No.: WO2017/170573
PCT Pub. Date: Oct. 5, 2017

(65) Prior Publication Data
US 2019/0105937 A1   Apr. 11, 2019

(30) Foreign Application Priority Data
Apr. 1, 2016 (JP) .............................. JP2016-074581

(51) Int. Cl.
| | | |
|---|---|---|
| *B41N 1/12* | (2006.01) | |
| *G03F 7/11* | (2006.01) | |
| *G03F 7/095* | (2006.01) | |
| *G03F 7/00* | (2006.01) | |
| *G03F 7/004* | (2006.01) | |
| *G03F 7/09* | (2006.01) | |
| *G03F 7/20* | (2006.01) | |
| *G03F 7/033* | (2006.01) | |
| *B41C 1/05* | (2006.01) | |

(52) U.S. Cl.
CPC .................. *B41N 1/12* (2013.01); *B41C 1/05* (2013.01); *G03F 7/00* (2013.01); *G03F 7/0043* (2013.01); *G03F 7/033* (2013.01); *G03F 7/091* (2013.01); *G03F 7/094* (2013.01); *G03F 7/095* (2013.01); *G03F 7/0955* (2013.01); *G03F 7/11* (2013.01); *G03F 7/202* (2013.01)

(58) Field of Classification Search
None
See application file for complete search history.

(56) References Cited

U.S. PATENT DOCUMENTS

| | | |
|---|---|---|
| 4,719,146 A | 1/1988 | Hohage et al. |
| 2004/0234886 A1 | 11/2004 | Rudolph et al. |
| 2005/0142480 A1 | 6/2005 | Bode et al. |
| 2015/0197079 A1 | 7/2015 | Mizoguchi et al. |
| 2016/0229172 A1 | 8/2016 | Stebani et al. |

FOREIGN PATENT DOCUMENTS

| | | |
|---|---|---|
| EP | 0180129 A1 | 5/1986 |
| EP | 1516745 A | 3/2005 |
| EP | 2657765 A1 | 10/2013 |
| JP | 2004-255812 A | 9/2004 |
| JP | 2005-221735 A | 8/2005 |
| JP | 4231791 B | 3/2009 |
| JP | 4817607 B | 11/2011 |
| JP | 2012/189848 A | 10/2012 |
| WO | 2013/148299 A2 | 10/2013 |
| WO | 2015/040094 A2 | 3/2015 |

OTHER PUBLICATIONS

Supplementary European Search Report for corresponding European Application No. 17775110.4 dated Mar. 4, 2019.
International Search Report issued with respect to Patent Application No. PCT/JP2017/012693, dated Jun. 27, 2017.
International Preliminary Report on Patentability issued with respect to Patent Application No. PCT/JP2017/012693, dated Oct. 2, 2018.
Supplementary European Search Report, EPO, Application No. 20163134.8, dated Jul. 10, 2020.

*Primary Examiner* — Joshua D Zimmerman
(74) *Attorney, Agent, or Firm* — Greenblum & Bernstein, P.L.C.

(57) ABSTRACT

A photosensitive resin constituent for a flexographic printing plate includes at least a support, a photosensitive resin composition layer, and a particle layer. The photosensitive resin composition layer contains a photosensitive resin composition containing a binder, a monomer, and a polymerization initiator. The particle layer contains a resin composition containing a binder having a crosslinkable group and a particle having a pore structure, and the particle having a pore structure has an average particle size of 1 μm or more and 10 μm or less, and a specific surface area of 350 $m^2/g$ or more and 1000 $m^2/g$ or less.

6 Claims, No Drawings

PHOTOSENSITIVE RESIN CONSTITUENT FOR FLEXOGRAPHIC PRINTING PLATE AND FLEXOGRAPHIC PRINTING PLATE

TECHNICAL FIELD

The present invention relates to a photosensitive resin constituent for a flexographic printing plate, and a flexographic printing plate.

BACKGROUND ART

As printing methods, a method in which printing can be performed by providing a three-dimensional shape to a printing plate and a method in which printing can be performed by imparting a chemical feature have been known.

Representative examples of the former include relief printing and intaglio printing.

In the relief printing, the printing can be performed by causing an ink to adhere to a convex portion of a printing plate, and in the intaglio printing, the printing can be performed by causing an ink to adhere to a concave portion of a printing plate.

Flexographic printing is a kind of the relief printing, and the printing is performed using a flexible printing plate of a resin, rubber or the like, and hence has a characteristic that the printing can be performed on a variety of printed bodies.

Since a three-dimensional shape is formed by lithography, photosensitivity is imparted to many of resin compositions used as materials of flexographic printing plates in recent years.

A photosensitive resin composition to be used for a flexographic printing plate usually contains a thermoplastic elastomer, a photopolymerizable unsaturated monomer and a photoinitiator.

A photosensitive resin constituent for a flexographic printing plate, that is, a layered body obtained at a previous stage of imparting a printing shape, usually has a structure including a support of a polyester film or the like, a layer of the photosensitive resin composition formed thereon, and if necessary, a protection layer formed on the photosensitive resin composition layer for purposes of smoothing contact with a negative film.

In order to perform plate-making of a flexographic printing plate from such a photosensitive resin constituent for a flexographic printing plate, the whole photosensitive resin constituent for the flexographic printing plate is first exposed to UV through the support (back exposure), and thus, the photosensitive resin composition is photopolymerized to form a thin and homogeneous cured layer.

Next, a negative film having a desired image is caused to adhere onto the photosensitive resin composition layer, and the photosensitive resin composition layer is subjected to image exposure (relief exposure) through the negative film to cure an image portion, and then, an unexposed portion is washed away with a development solvent to remove the unexposed portion.

Thereafter, a surface of the photosensitive resin constituent for the flexographic printing plate on which irregularities have been thus formed is subjected to post-exposure, and thus, a flexographic printing plate is obtained.

The printing using a flexographic printing plate is performed by a method in which an ink is supplied with an ink supply roll or the like onto a convex portion on the surface of the flexographic printing plate having irregularities formed thereon, and the ink disposed on the surface of the convex portion is transferred onto a printed body by bringing the flexographic printing plate into contact with the printed body.

In recent years, in accordance with increasing demands for improvement in print quality, a technique has been developed in which an infrared laser-ablative UV blocking layer is provided instead of a conventionally used negative film on a photosensitive resin composition layer, the UV blocking layer is ablated with a laser into a desired pattern, and then exposure is performed to provide a portion to be cured with UV and a portion not to be cured with UV.

In the conventional method using a negative film, the photosensitive resin composition layer is blocked from oxygen by the negative film in curing through the UV exposure, and hence, a cured portion having the same size as an image size of the negative film can be formed without being affected by radical polymerization inhibition by oxygen.

On the other hand, in the method in which the UV blocking layer is ablated with an infrared laser and then the exposure is performed as described above, the surface of the photosensitive resin composition layer is affected by the radical polymerization inhibition by oxygen, and therefore, a fine dot smaller than the size of an image provided in the UV blocking layer can be formed, and high resolution can be thus attained.

When the printing is continuously performed for a long period of time, however, a fine dot is abraded through contact between an ink supply roll and a printed body.

The abrasion of the printing plate is unpreferable from the viewpoint of stability in print quality.

On the other hand, an ink density in a blotted portion called as solid printing is also a significant factor in the quality of a printed matter.

An ink density can be increased by increasing a contact pressure between an ink supply roll and a printed body, and a printing plate.

A high contact pressure is, however, not preferable because it causes dot gain and also causes abrasion of the printing plate to proceed.

As a method for increasing an ink density, a method in which a surface of a printing plate is finely shaped to increase the surface area has been proposed.

In this method, a larger amount of an ink can be supplied from an ink supply roll to the surface of the printing plate, and hence the ink density can be increased.

Patent Literature 1 has proposed a method in which a mat layer containing a matting agent is disposed on a photosensitive resin composition layer, so as to transfer minute recess shapes onto a surface of the photosensitive resin composition layer by pressing the photosensitive resin composition layer against minute convexes formed by the matting agent.

This method has, however, a problem that the recess shapes on the surface of the photosensitive resin composition layer are lost during a washing step, and hence an effect of stably increasing an ink density cannot be obtained. When affected by the radical polymerization inhibition by oxygen in curing through exposure, an uppermost surface portion of the photosensitive resin composition layer is not sufficiently cured, and hence there arises a problem that the recess shapes are further lost through the washing step.

Patent Literature 2 has proposed a method in which a mat layer containing a matting agent is disposed on a photosensitive resin composition layer, so as to provide convexes derived from the matting agent to the surface by fixing the mat layer on the photosensitive resin composition layer during plate-making of a printing plate.

This method has, however, a problem that the amount of the matting agent fixed on the surface is insufficient and hence an effect of stably increasing an ink density cannot be obtained. When affected by the radical polymerization inhibition by oxygen, the amount of the fixed matting agent is further reduced through the washing step because the photosensitive resin composition layer is insufficiently cured in some portions.

Patent Literature 3 has proposed a method in which an elastomer layer containing a particulate substance is disposed on a surface of a flexographic printing plate.

Since adhesion strength between the particulate substance and the elastomer layer is insufficient, however, the particulate substance is washed away during a washing step using a development solvent, and there arises a problem that an effect of sufficiently increasing an ink density cannot be obtained. The particulate substance is dropped off through abrasion caused in a printing step, and hence, when the printing is continued for a long period of time, there arises a problem that the effect of increasing the ink density is degraded.

CITATION LIST

Patent Literature

Patent Literature 1: Japanese Patent No. 4817607
Patent Literature 2: Japanese Patent No. 4231791
Patent Literature 3: International Publication No. WO 2013/148299

SUMMARY OF INVENTION

Technical Problem

As described above, according to the conventional techniques, it is technically difficult to obtain a photosensitive resin constituent for a flexographic printing plate that attains both ink density increase and retainment of an ink density through long-term printing, and there is a problem that their characteristics are still insufficient for stable use in a printing step.

Therefore, an object of the present invention is to provide a photosensitive resin constituent for a flexographic printing plate that can increase an ink density and can retain an ink density even through long-term printing, and a flexographic printing plate.

Solution to Problem

The present inventor has made earnest studies to solve the above-described problems, resulting in finding that the above-described problems of the conventional techniques can be solved when, in a photosensitive resin constituent for a flexographic printing plate having a multi-layer structure, the photosensitive resin constituent for the flexographic printing plate comprises at least a support, a photosensitive resin composition layer and a particle layer, the photosensitive resin composition layer contains a photosensitive resin composition containing a binder, a monomer and a polymerization initiator, the particle layer contains a resin composition layer containing a binder having a crosslinkable group, and a particle having a pore structure, and the particle having a pore structure has an average particle size falling in a prescribed numerical range, and a specific surface area falling in a prescribed numerical range, and thus, the present invention was accomplished.

Specifically, the present invention is:

[1]
A photosensitive resin constituent for a flexographic printing plate, comprising at least a support, a photosensitive resin composition layer, and a particle layer, wherein
the photosensitive resin composition layer contains a photosensitive resin composition containing a binder, a monomer, and a polymerization initiator,
the particle layer contains a resin composition containing a binder having a crosslinkable group and a particle having a pore structure, and
the particle having a pore structure has an average particle size of 1 µm or more and 10 µm or less, and a specific surface area of 350 $m^2/g$ or more and 1000 $m^2/g$ or less.

[2]
The photosensitive resin constituent for the flexographic printing plate according to [1] above, comprising, on the particle layer, an infrared laser-ablative UV blocking layer containing an infrared sensitive substance.

[3]
The photosensitive resin constituent for the flexographic printing plate according to [1] or [2] above, wherein the particle having a pore structure is an inorganic oxide.

[4]
The photosensitive resin constituent for the flexographic printing plate according to any one of [1] to [3] above, wherein the particle having a pore structure is silica.

[5]
The photosensitive resin constituent for the flexographic printing plate according to any one of [1] to [4] above, wherein the binder having a crosslinkable group is an elastomer having a number average molecular weight of 50,000 or more and 300,000 or less.

[6]
The photosensitive resin constituent for the flexographic printing plate according to any one of [1] to [5] above, wherein a content of the particle having a pore structure is 10% by mass or more and 50% by mass or less of the particle layer.

[7]
The photosensitive resin constituent for the flexographic printing plate according to any one of [1] to [6] above, wherein the particle having a pore structure has oil absorption of 0.5 mL/g or more and 3.0 mL/g or less.

[8]
A flexographic printing plate, wherein
arithmetic average roughness (Ra) of a printing surface is 0.3 µm or more and 0.7 µm or less, and
skewnesses (Rsk) obtained before and after an abrasion test performed by causing a wear ring of a Taber abraser to make 100 rotations at 60 rpm under a load of 250 g both have positive values.

[9]
The flexographic printing plate according to [8] above, comprising at least a support, and two or more resin composition layers having different compositions, wherein
a resin composition layer corresponding to a printing surface comprises a particle having a pore structure, and
the particle having a pore structure has an average particle size of 1 µm or more and 10 µm or less, and a specific surface area of 350 $m^2/g$ or more and 1000 $m^2/g$ or less.

[10]
The flexographic printing plate according to [9] above, wherein the resin composition layer corresponding to the printing surface has a thickness of 5 µm or more and 100 µm or less.

Advantageous Effects of Invention

According to the present invention, a photosensitive resin constituent for a flexographic printing plate that can attain a high ink density of a printed matter when formed into a flexographic printing plate and retain the high ink density through long-term printing, and a flexographic printing plate can be provided.

DESCRIPTION OF EMBODIMENT

Now, an embodiment for practicing the present invention (hereinafter simply referred to as the "present embodiment") will be described in detail.

It is noted that the present invention is not limited to the following embodiment but can be variously modified within the scope and spirit of the present invention.

[Photosensitive Resin Constituent for Flexographic Printing Plate]

A photosensitive resin constituent for a flexographic printing plate of the present embodiment comprises at least a support, a photosensitive resin composition layer, and a particle layer, wherein the photosensitive resin composition layer contains a photosensitive resin composition containing a binder, a monomer, and a polymerization initiator, the particle layer contains a resin composition containing a binder having a crosslinkable group, and a particle having a pore structure, and the particle having a pore structure has an average particle size of 1 μm or more and 10 μm or less and a specific surface area of 350 $m^2$/g or more and 1000 $m^2$/g or less.

The photosensitive resin constituent for the flexographic printing plate of the present embodiment comprises the photosensitive resin composition layer and the particle layer successively stacked on the support, and the particle layer is disposed to work as a printing surface after being made into a flexographic printing plate.

Incidentally, a prescribed protection layer or an infrared laser-ablative UV blocking layer containing an infrared sensitive substance may be provided on the particle layer if necessary.

An adhesive layer for attaining adhesion between the support and the photosensitive resin composition layer may be provided therebetween.

(Support)

A printing plate used in flexographic printing usually has a structure in which a photosensitive resin composition layer is stacked on a support.

Examples of the support used in the photosensitive resin constituent for the flexographic printing plate of the present embodiment include, but are not limited to, a polypropylene film, a polyethylene film, and a polyester film of polyethylene terephthalate, polyethylene naphthalate or the like; and a polyamide film.

The support is preferably a dimensionally stable polyester film having a thickness in a range of 75 to 300 μm.

On the support, an adhesive layer for attaining good adhesion to the photosensitive resin composition layer may be provided.

An example of a material for forming the adhesive layer includes, but is not limited to, a composition containing a polymer such as polyurethane, polyamide and/or a thermoplastic elastomer, and an adhesive active ingredient such as an isocyanate compound and/or an ethylenic unsaturated compound.

The adhesive layer may further contain various auxiliary additive components such as a plasticizer, a thermal polymerization inhibitor, a UV absorber, a halation inhibitor, a light stabilizer, a photoinitiator, a photopolymerizable monomer, and a dye.

(Photosensitive Resin Composition Layer)

The photosensitive resin composition layer is a layer disposed between the support and the particle layer described later and containing at least one photosensitive resin composition.

The photosensitive resin composition is a resin composition containing at least one binder, a monomer, and a polymerization initiator.

To the photosensitive resin composition layer, another component may be added as long as the photosensitivity thereof is not impaired.

<Binder>

The binder is a polymer used as a main component of the photosensitive resin composition, and examples thereof include, but are not limited to, a hydrocarbon-based polymer, polyamide, polyimide, polyurethane and polyester.

Since the characteristics of the binder largely affect the characteristics of a flexographic printing plate obtained after plate-making, it is preferably an elastomer.

Specific examples of the binder include natural or synthetic polymers of conjugated diene hydrocarbons, such as polyisoprene, 1,2-polybutadiene, and 1,4-polybutadiene.

In particular, a preferable example of the binder includes a block copolymer containing a polymer block mainly containing a conjugated diene and a polymer block mainly containing a vinyl aromatic hydrocarbon.

Examples of the conjugated diene include, but are not limited to, monomers such as 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene and chloroprene, among which isoprene and 1,3-butadiene are particularly preferred from the viewpoint of wear resistance.

Examples of the vinyl aromatic hydrocarbon include, but are not limited to, monomers such as styrene, t-butyl styrene, divinyl benzene, 1,1-diphenyl styrene, N,N-dimethyl-p-aminoethyl styrene, N,N-diethyl-p-aminoethyl styrene, vinyl pyridine, p-methylstyrene, tertiary butylstyrene, α-methylstyrene and 1,1-diphenylethylene. In particular, styrene is preferred from the viewpoint that the photosensitive resin constituent for the flexographic printing plate can be smoothly molded at a comparatively low temperature.

Merely one of these monomers may be singly used, or two or more of these may be used together.

Two or more of these polymers may be used in combination.

<Monomer>

The monomer refers to a compound having a radically polymerizable unsaturated double bond.

Examples of the monomer include, but are not limited to, esters of acrylic acid, methacrylic acid, fumaric acid, maleic acid and the like; derivatives of acrylamide and methacrylamide; allyl esters, styrene and derivatives thereof; and N-substituted maleimide compounds.

Specific examples of the monomer include diacrylates and dimethacrylates of alkanediols such as hexanediol and nonanediol; diacrylates and dimethacrylates of ethylene glycol, diethylene glycol, propylene glycol, dipropylene glycol, polyethylene glycol and butylene glycol; and trimethylolpropane tri(meth)acrylate, dimethyloltricyclodecane di(meth)acrylate, isobornyl (meth)acrylate, phenoxypolyethylene glycol (meth)acrylate, pentaerythritol tetra(meth) acrylate, N,N'-hexamethylene bisacrylamide and methacrylamide, styrene, vinyl toluene, divinyl benzene, diacrylphthalate, triallylcyanurate, fumaric acid diethyl ester, fumaric acid dibutyl ester, fumaric acid dioctyl ester, fumaric acid distearyl ester, fumaric acid butyl octyl ester, fumaric acid diphenyl ester, fumaric acid dibenzyl ester, maleic acid dibutyl ester, maleic acid dioctyl ester, fumaric acid bis(3-phenylpropyl) ester, fumaric acid dilauryl ester, fumaric acid dibehenyl ester and N-lauryl maleimide.

One of these may be singly used, or two or more of these may be used in combination.

<Polymerization Initiator>

The polymerization initiator is a compound that absorbs light energy to generate a radical, any of various known initiators can be used, and examples thereof include various organic carbonyl compounds, among which an aromatic carbonyl compound is preferred.

Examples of the polymerization initiator include, but are not limited to, benzophenone, 4,4-bis(diethylamino)benzophenone, t-butylanthraquinone, 2-ethylanthraquinone, and thioxanthones such as 2,4-diethylthioxanthone, isopropylthioxanthone, and 2,4-dichlorothioxanthone; acetophenones such as diethoxyacetophenone, 2,2-methoxy-phenylacetophenone, 2-hydroxy-2-methyl-1-phenylpropane-1-one, benzyl dimethyl ketal, 1-hydroxycyclohexyl-phenyl ketone, 2-methyl-2-morpholino(4-thiomethylphenyl)propane-1-one, and 2-benzyl-2-dimethylamino-1-(4-morpholinophenyl)-butanone; benzoin ethers such as benzoin methyl ether, benzoin ethyl ether, benzoin isopropyl ether and benzoin isobutyl ether; acylphosphine oxides such as 2,4,6-trimethylbenzoyldiphenylphosphine oxide, bis(2,6-dimethoxybenzoyl)-2,4,4-trimethylpentylphosphine oxide, and bis(2,4,6-trimethylbenzoyl)-phenylphosphine oxide; methyl benzoyl formate; 1,7-bisacridinyl heptane; and 9-phenyl acridine.

<Additional Components>

To the photosensitive resin composition, various auxiliary additive components such as a plasticizer, a thermal polymerization inhibitor, a UV absorber, a halation inhibitor and a light stabilizer can be added in addition to the above-described components as long as the photosensitivity thereof is not impaired.

Examples of the plasticizer include, but are not limited to, hydrocarbon oils such as naphthene oil and paraffin oil; conjugated diene rubbers mainly containing a liquid diene, such as a liquid acrylonitrile-butadiene copolymer and a liquid styrene-butadiene copolymer; and polystyrene, cebacic acid ester and phthalic acid ester having a number average molecular weight of 2,000 or less.

To these compounds, a photopolymerizable reactive group may be imparted.

(Particle Layer)

The particle layer is a layer that is disposed on the photosensitive resin composition layer and contains a resin composition containing a particle having a pore structure.

The particle layer may have a single layer structure or a multilayer structure.

The resin composition containing a particle having a pore structure is a resin composition containing a binder having at least one crosslinkable group, and a particle having a pore structure, and the above-described monomer for imparting photosensitivity and a polymerization initiator or the like may be added thereto.

The components contained in the adjacent photosensitive resin composition layer may be transferred thereto after being formed into the photosensitive resin constituent for the flexographic printing plate, resulting in that a component different from the binder and the particle having a pore structure may be contained.

At the time of curing through the exposure of the photosensitive resin composition layer, the binder having a crosslinkable group is photocured and remains in a printing plate after the plate-making of the printing plate, and therefore, the particle layer corresponds to an uppermost surface layer of the printing plate, namely, a printing surface used in printing.

The thickness of the particle layer is preferably 100 µm or less so as to attain good image reproducibility, and is preferably 20 µm or more so as not to be lost through a washing step. In other words, the thickness is preferably 20 µm or more and 100 µm or less, and more preferably 20 µm or more and 60 µm or less.

A ratio of the particle having a pore structure added to the particle layer is preferably 10% by mass or more assuming that the whole particle layer is 100% by mass in order to sufficiently shape the surface of the particle layer, namely, the printing surface.

The ratio is preferably 50% by mass or less in order to prevent degradation of the image reproducibility.

The ratio of the particle in the particle layer is more preferably 10% by mass or more and 45% by mass or less, and more preferably 15% by mass or more and 40% by mass or less.

<Binder having Crosslinkable Group>

The binder having a crosslinkable group refers to a binder having a radically polymerizable unsaturated double bond.

The unsaturated double bond may be contained in a main chain of a polymer as in the natural or synthetic polymers of the conjugated diene hydrocarbons.

Even when an unsaturated double bond is not contained in a main chain, an unsaturated double bond may be introduced into a terminal portion by a terminal blocking agent for a synthetic reaction, or the unsaturated double bond may be introduced into a side chain by subjecting the polymer to a prescribed treatment after the synthetic reaction.

The binder having a crosslinkable group is a binder for the particle layer working as the printing surface and hence largely affects the print quality of the flexographic printing plate, and therefore, is preferably an elastomer.

Examples of the elastomer include the natural or synthetic polymers of the conjugated diene hydrocarbons, block copolymers each containing a polymer block mainly containing a conjugated diene and a polymer block mainly containing a vinyl aromatic hydrocarbon, polyurethane obtained by reacting a terminal hydroxyl group with isocyanate alkyl (meth)acrylate, and polyurethane obtained by reacting a terminal isocyanate group with hydroxyalkyl (meth)acrylate.

The binder having a crosslinkable group has a number average molecular weight of preferably 50,000 or more so that the particle having a pore structure contained in the particle layer can be held therein. In order that the binder having a crosslinkable group can be sufficiently filled in a pore of the particle having a pore structure, the number average molecular weight is preferably 300,000 or less.

The number average molecular weight of the binder having a crosslinkable group is more preferably 70,000 or more and 275,000 or less, and further preferably 80,000 or more and 250,000 or less.

The number average molecular weight refers to a molecular weight in terms of polystyrene measured by gel permeation chromatography (GPC).

Merely one binder having a crosslinkable group may be singly used, or two or more of these may be used in combination.

<Particle Having Pore Structure>

The particle having a pore structure refers to a particle having a fine pore, and has a large surface area per unit mass owing to the presence of the fine pore.

The particle having a pore structure used in the photosensitive resin constituent for the flexographic printing plate of the present embodiment has a specific surface area of 350 $m^2/g$ or more and 1000 $m^2/g$ or less, preferably 400 $m^2/g$ or more and 900 $m^2/g$ or less, and more preferably 450 $m^2/g$ or more and 800 $m^2/g$ or less in order that the "binder having a crosslinkable group" described above can be sufficiently filled in the pore.

When the specific surface area of the particle having a pore structure falls in the above-described numerical range, the binder having a crosslinkable group is sufficiently filled in the pore, and when the resin composition is cured under this condition, the particle can be effectively prevented from dropping off from the surface of the printing plate, an irregular structure for sufficiently holding an ink on the printing surface can be retained even through long-term printing, and therefore, an ink density can be retained for a long period of time.

In a portion where the particle is exposed on the surface of the printing plate, the ink can be effectively taken in and held in the pore of the pore structure, and can be released, and therefore, an initial ink density is increased, and the ink density can be retained for a long period of time.

The specific surface area is a value measured by a gas adsorption method, and can be measured in accordance with JIS-Z-8830.

In order to sufficiently shape the target surface of the printing plate, an average particle size of the particle having a pore structure is 1 μm or more.

From the viewpoint of dispersibility of the particle in the particle layer, the average particle size of the particle is 10 μm or less.

In other words, the average particle size is 1 μm or more and 10 μm or less, more preferably 2 μm or more and 8 μm or less, and further preferably 3 μm or more and 7 μm or less.

Herein, the average particle size can be measured by a laser diffraction scattering method performed in accordance with JIS-Z-8825.

Examples of the particle having a pore structure include, but are not limited to, inorganic oxides such as silica, alumina and ceria; carbon particles such as carbon black; and polymer particles containing polymethyl methacrylate, polyurethane and the like.

In particular, the inorganic oxides are preferred because they are excellent in chemical stability and have high specific surface areas, and among them, silica is particularly preferred because it has a high specific surface area.

Such a particle may be further subjected to a surface treatment as long as the pore structure is not lost.

As described above, the particle having a pore structure attains a high ink density of a printed matter, and exhibits an effect that the high ink density can be retained through long-term printing.

The particle having a pore structure can take a substance in the pore thereof.

The binder having a crosslinkable group contained in the particle layer enters the pore of the particle to be cured in the plate-making, and thus, the particle is physically kept in the particle layer, and therefore, the particle is prevented from dropping off through abrasion caused in the washing step and at the time of printing. Since the ink can be held within the pore of the particle at the time of printing, the amount of the ink supplied from an ink supply roll to the printing plate and the amount of the ink held on the surface of the printing plate are increased, so as to increase the ink density of the printed matter. Furthermore, since the particle is prevented from dropping off, a sufficient amount of the ink can be held on the surface of the printing plate even through the long-term printing, and thus, the high ink density can be retained for a long period of time.

The amount of the ink held on the surface of the printing plate is larger as oil absorption of the particle having a pore structure is larger, and hence, it is presumed that a particle having large oil absorption is preferred from the viewpoint of increasing the ink density.

On the other hand, since there is generally negative correlation between the specific surface area and the oil absorption of a particle, it has been regarded that the effect of increasing the ink density cannot be sufficiently obtained when a particle has a large specific surface area, but in the photosensitive resin constituent for the flexographic printing plate of the present embodiment and the flexographic printing plate using the same, an effect of sufficiently increasing the ink density can be obtained by employing the specific surface area falling in the above-described numerical range and the oil absorption falling in a numerical range described below.

The oil absorption of the particle having a pore structure is preferably 0.5 mL/g or more from the viewpoint of retaining a sufficient amount of the ink on the surface of the printing plate, and is preferably 3.0 mL/g or less in order to cause the binder having a crosslinkable group to efficiently enter the pore of the particle having a pore structure. In other words, the oil absorption is preferably 0.5 mL/g or more and 3.0 mL/g or less.

The oil absorption is more preferably 0.75 mL/g or more and 2.7 mL/g or less, and further preferably 0.90 mL/g or more and 2.5 mL/g or less.

The oil absorption can be measured by a linseed oil method performed in accordance with JIS-K5101.

The oil absorption can be controlled to fall in the above-described numerical range in accordance with a primary particle size and a pore structure of the particle.

Incidentally, that the photosensitive resin constituent for the flexographic printing plate comprises at least the support, the photosensitive resin composition layer and the particle layer containing the resin composition containing the particle having a pore structure can be verified by cleaving the photosensitive resin constituent for the flexographic printing plate before the curing through exposure and checking the layer structure.

In the photosensitive resin constituent for the flexographic printing plate, that the addition amount of the particle having a pore structure contained in the particle layer is 10% by mass or more and 50% by mass or less of the particle layer, that the average particle size of the particle is 1 μm or more and 10 μm or less, and that the specific surface area of the particle is 350 $m^2/g$ or more and 1000 $m^2/g$ or less can be verified by separating the particle layer from the photosensitive resin composition layer by a microtome or the like, and dissolving the resin composition contained in the resultant particle layer in a prescribed solvent to separate the particle for the measurement.

Furthermore, that the number average molecular weight of the binder having a crosslinkable group contained in the particle layer is 50,000 or more and 300,000 or less can be verified by subjecting the solution of the particle layer separated as described above to the gel permeation chromatography (GPC) for measurement.

[Flexographic Printing Plate]

In the flexographic printing plate of the present embodiment, arithmetic average roughness (Ra) of the printing surface is 0.3 μm or more and 0.7 μm or less, and skewnesses (Rsk) obtained before and after an abrasion test performed by causing a wear ring of a Taber abraser to make 100 rotations at 60 rpm under a load of 250 g both have positive values.

The arithmetic average roughness (Ra) of the printing surface is preferably 0.33 μm or more and 0.65 μm or less, and more preferably 0.36 μm or more and 0.60 μm or less.

The skewness (Rsk) is preferably 0.1 or more, and more preferably 0.2 or more.

When the above-described structure is employed, the flexographic printing plate of the present embodiment can retain an ink density through long-term printing.

The arithmetic average roughness (Ra) of the printing surface is an index corresponding to the amplitude of the surface roughness. The skewness (Rsk) is an index corresponding to skewness, and indicates symmetry of ridge portions and valley portions with respect to an average surface. When the skewness is positive, the surface is biased downward, and when it is negative, the surface is biased upward.

In order to increase the ink density, the skewness of the printing surface is preferably positive, and in order to stably retain a high ink density through long-term printing, the skewness is preferably positive also through the long-term printing.

The arithmetic average roughness (Ra) and the skewness (Rsk) of the flexographic printing plate of the present invention can be calculated by measuring the surface shape by various methods. Examples of the method include those using a laser microscope and an atomic force microscope (AFM), and specifically, the measurement can be performed by a method described in an example below.

Incidentally, in the flexographic printing plate, that the arithmetic average roughness (Ra) of the surface is 0.3 μm or more and 0.7 μm or less, and that the skewnesses (Rsk) obtained before and after an abrasion test performed by causing a wear ring of a Taber abraser to make 100 rotations at 60 rpm under a load of 250 g both have positive values can be verified by measuring the surface with a laser microscope and an atomic force microscope (AFM) no matter whether it is measured before the curing through exposure, after the curing through exposure, or after the plate-making of the printing plate.

The flexographic printing plate in which the arithmetic average roughness (Ra) of the printing surface is 0.3 μm or more and 0.7 μm or less and the skewnesses (Rsk) obtained before and after the abrasion test both have positive values can be obtained, in a flexographic printing plate comprising at least a support and two or more resin composition layers having different compositions, by using a particle layer containing a particle having a pore structure as a resin composition layer forming a printing surface, and by adjusting the average particle size and the specific surface area of the particle having a pore structure.

Specifically, in the printing plate of the present embodiment, the average particle size of the particle having a pore structure is 1 μm or more and 10 μm or less, and the specific surface area thereof is 350 $m^2/g$ or more and 1000 $m^2/g$ or less.

The average particle size of the particle having a pore structure is preferably 2 μm or more and 8 μm or less, and more preferably 3 μm or more and 7 μm or less.

The specific surface area of the particle having a pore structure is preferably 400 $m^2/g$ or more and 900 $m^2/g$ or less, and more preferably 450 $m^2/g$ or more and 800 $m^2/g$ or less.

When the average particle size and the specific surface area of the particle having a pore structure are respectively set to fall in the above-described numerical ranges, the amount of an ink supplied from an ink supply roll to the printing plate and the amount of the ink held on the surface of the printing plate can be increased, so as to increase the ink density of a printed matter.

Incidentally, the two or more resin composition layers having different compositions contained in the printing plate of the present embodiment include a photosensitive resin composition layer obtained after exposure processing, and a particle layer containing the particle having a pore structure, and the resin composition layer working as the printing surface corresponds to the particle layer containing the particle having a pore structure obtained after the exposure processing.

The thickness of the resin composition layer working as the printing surface is preferably 5 μm or more from the viewpoint of obtaining an effect of stably increasing an ink density, and is preferably 100 μm or less from the viewpoint of obtaining good image reproducibility. Specifically, the thickness is preferably 5 μm or more and 100 μm or less, more preferably 10 μm or more and 80 μm or less, and further preferably 15 μm or more and 60 μm or less.

[Method for Producing Flexographic Printing Plate]

The flexographic printing plate is obtained by obtaining a photosensitive resin constituent for flexographic a printing plate by using the above-described photosensitive resin composition and the resin composition containing the particle having a pore, successively stacking these compositions on a prescribed support to form a photosensitive resin composition layer and a particle layer, and further performing pattern exposure using a transparent image carrier and removing an unexposed portion by washing.

The photosensitive resin constituent for the flexographic printing plate of the present embodiment may have tackiness at normal temperature depending on selection of a material of the resin composition layer forming the printing surface corresponding to the uppermost surface layer in some cases, and a solvent-soluble and non-tacky prescribed protection layer may be further provided on the surface of the uppermost surface layer in order to improve contact property with a negative film to be stacked thereon or to make a negative film reusable.

The protection layer needs to be thin and flexible, for example, contains a substance soluble in a solvent used as a washing solution.

Examples of a material used for forming the protection layer include, but are not limited to, crystalline 1,2-polybutadiene, a soluble polyamide, partially saponified polyvinyl acetate and cellulose ester. In particular, a soluble polyamide is preferred. Such a substance may be dissolved in a proper solvent to use the resultant solution to directly coat the surface of the photosensitive resin constituent for the flexographic printing plate, or may be coated on a film of polyester, polypropylene or the like to laminate, for transfer, the resultant film on the photosensitive resin constituent for the flexographic printing plate.

The negative film is caused to adhere to the protection layer, the resultant is exposed, and thereafter, the protection layer is removed by dissolution or the like simultaneously with washing away an unexposed portion of the photosensitive resin constituent for the flexographic printing plate.

A UV blocking layer containing an infrared sensitive substance may be formed on the photosensitive resin constituent for the flexographic printing plate instead of the protection layer, so as to use the UV blocking layer as a transparent image carrier by directly drawing an image with an infrared laser.

Also in this case, the UV blocking layer is removed simultaneously with washing away an unexposed portion after completing the exposure.

The flexographic printing plate of the present embodiment can be produced by using the photosensitive resin constituent for the flexographic printing plate of the present embodiment. Now, an example of the production method will be described.

First, exposure is performed through the support to photocure the photosensitive resin composition layer, and thus, a thin homogeneous cured layer is provided (back exposure).

Subsequently, a negative film is placed on the particle layer further formed on the photosensitive resin composition layer, and the image exposure (relief exposure) is performed through the negative film, or through a UV blocking layer having been provided on the particle layer formed on the photosensitive resin composition layer and having been subjected to laser drawing.

Thereafter, a portion not exposed (namely, a portion not photocured) is washed with a development solvent to form a desired image, namely, a relief image, and thus, the printing plate is obtained.

Examples of a light source used for photocuring the photosensitive resin constituent for the flexographic printing plate include, but are not limited to, a high pressure mercury lamp, a UV fluorescent lamp, an LED, a carbon arc lamp, a xenon lamp and sunlight.

The exposure through the negative film and the exposure through the support may be performed in either order, but from the viewpoint of the image reproducibility, the exposure through the support is preferably performed first.

Examples of the development solvent include, but are not limited to, chlorine-based organic solvents such as 1,1,1-trichloroethane and tetrachloroethylene; esters such as heptyl acetate and 3-methoxybutyl acetate; hydrocarbons such as a petroleum distillate, toluene and decalin; and a mixture of any of these with an alcohol such as propanol, butanol or pentanol.

EXAMPLES

The present embodiment will now be specifically described with reference to specific examples and comparative examples, and it is noted that the present embodiment is not limited to the following examples.

Evaluation Methods (1) Evaluation of Ink Density

Printing was performed by using a printing plate obtained in each of [Examples] and [Comparative Examples] described later.

As a solvent ink, Process X Cyan (manufactured by Toyo Ink Manufacturing Co., Ltd., trade name) was used, and as a printed body, an OPP film was used.

An anilox roll of 800 lpi (cell volume: 3.8 $cm^3/m^2$) was used, a cushion tape of 3M1020 (manufactured by Sumitomo 3M Limited, trade name) was used, and the printing was performed at a printing speed of 100 m/min.

An ink density of a printed matter was measured using SpectroEye (manufactured by Sakata Ink Eng. Co., Ltd., trade name). An average of concentrations measured at seven points was defined as the ink density.

In order to evaluate an ink density obtained by a printing surface after performing long-term printing, an ink density of the printing plate obtained after abrasion with a wear ring was evaluated.

For the abrasion, a Taber abraser (manufactured by Test Sangyo Co., Ltd.) was used, and CARIBRADE CS-10F (manufactured by Taber Industries) was used as the wear ring.

Under a load of 250 g, 100 rotations were made at 60 rpm, and then, the ink density was measured as described above.

The ink densitys obtained before and after the above-described abrasion test are shown in [Table 1] below.

(2) Evaluation of Arithmetic Average Roughness (Ra) and Skewness (Rsk)

The arithmetic average roughness (Ra) of the printing surface of the printing plate obtained in each of [Examples] and [Comparative Examples] described below, and the skewnesses (Rsk) of the printing surface of the printing plate before and after the above-described abrasion test were evaluated.

A laser microscope, VK-X100 (manufactured by KEYENCE Corporation, trade name) was used to measure a surface shape of a surface of solid printing, and arithmetic average roughness (Ra) in a region of 200 μm×200 μm and skewnesses (Rsk) before and after the abrasion test were calculated.

It is noted that the abrasion test was performed in the same manner as in the method described above in ((1) Evaluation of Ink density), and an abraded surface was similarly measured with the laser microscope.

Example 1

Production of Photosensitive Resin Composition

A photosensitive resin composition to be contained in a photosensitive resin composition layer was produced by charging a kneader (Powlex Corp., FM-MW-3) with starting materials described below and mixing the resultant at 140° C. for 60 minutes.

The photosensitive resin composition was obtained by kneading, under the above-described conditions, 60 parts by mass of a thermoplastic elastomer, TR2787 (manufactured by JSR Corporation, trade name), that is, a styrene-butadiene block copolymer used as a binder, 10 parts by mass of 1,9-nonanediol acrylate used as a monomer, 2 parts by mass of 2,2-dimethoxy-phenylacetophenone used as a polymerization initiator, and as additional components, 27 parts by mass of Polyvest P130 (manufactured by Degussa, trade name), that is, a liquid polybutadiene used as a plasticizer, and 1 part by mass of dibutyl hydroxy toluene used as a thermal polymerization inhibitor.

Production of Support Including Adhesive Layer

As a solution for an adhesive layer to be used for coating a support, 55 parts by mass of Tufprene 912 (manufactured by Asahi Kasei Chemicals Corporation, trade name), that is, a block copolymer of styrene and 1,3-butadiene, 38 parts by mass of paraffin oil (average carbon number: 33, average molecular weight: 470), 2.5 parts by mass of 1,9-nonanediol diacrylate, 1.5 parts by mass of 2,2-dimethoxy-phenylacetophenone, 3 parts by mass of Epoxy Ester 3000M (manufactured by Kyoeisha Chemical Co., Ltd., trade name), 1.5 parts by mass of Valifast Yellow 3150 (manufactured by Orient Chemical Industries Co., Ltd., trade name) were dissolved in toluene to obtain a solution having a solid content of 25%.

Thereafter, a knife coater was used to apply the resultant solution onto one surface of a polyester film having a thickness of 100 μm to attain UV transmittance of 10%, and the resultant was dried at 80° C. for 1 minute to obtain a support including an adhesive layer.

Production of Cover Sheet Including UV Blocking Layer

Sixty-five (65) parts by mass of Asaflex 810 (manufactured by Asahi Kasei Chemicals Corporation, trade name), that is, a block copolymer of styrene and 1,3-butadiene, and 35 parts by mass of carbon black used as an infrared sensitive substance were kneaded using a kneader, and the resultant was cut into a shape of a pellet.

Thereafter, 90 parts by mass of the pellet and 10 parts by mass of 1,6-hexanediol adipate were dissolved, by using ultrasonic waves, in a mixed solvent prepared in a mass ratio of ethyl acetate/butyl acetate/propylene glycol monomethyl ether acetate of 50/30/20, and thus, a homogeneous solution having a solid content of 12% by mass was prepared. This solution was applied, using a knife coater, on a polyester film having a thickness of 100 μm to be used as a cover sheet into an application amount after drying of 4 to 5 g/m², and the resultant was dried at 80° C. for 1 minute to obtain a cover sheet including an infrared laser-ablative UV blocking layer.

Production of Cover Sheet Including Particle Layer and UV Blocking Layer

A homogeneous solution having a solid content of 25% was prepared by dissolving, in toluene by using ultrasonic waves, 75 parts by mass of a thermoplastic elastomer, TR2787 (manufactured by JSR Corporation, trade name), that is, a styrene-butadiene block copolymer, having a number average molecular weight of 120,000 used as a binder having a crosslinkable group and 25 parts by mass of silica of Sylysia 430 (manufactured by Fuji Silysia Chemical Ltd., average particle size: 4.1 μm, specific surface area 350 m²/g, oil absorption: 2.3 mL/g) used as a particle having a pore structure.

The resultant solution was applied, by using a knife coater, on the UV blocking layer of the "cover sheet including a UV blocking layer" produced as described above into a thickness after drying of 50 μm, and the resultant was dried at 80° C. for 4 minutes to form a cover sheet including a particle layer on the UV blocking layer.

Production of Photosensitive Resin Constituent for Flexographic Printing Plate

A photosensitive resin constituent for a flexographic printing plate was produced by using the photosensitive resin composition, the support including the adhesive layer, and the cover sheet including the particle layer and the UV blocking layer produced as described above.

An adhesive layer side of the support was abutted against the photosensitive resin composition produced as described above, the resultant was enclosed between the support and the cover sheet with a particle layer side of the cover sheet facing to the photosensitive resin composition, and the resultant was heated and compression molded into a thickness of 1.5 mm as a whole, resulting in obtaining the photosensitive resin constituent for the flexographic printing plate.

At this point, the heating and the compression molding were performed under condition of 130° C. under a pressure of $1.96 \times 10^7$ Pa.

Example 2

As the particle having a pore structure, silica of Sylysia 550 (manufactured by Fuji Silysia Chemical Ltd., average particle size: 3.9 μm, specific surface area 500 m²/g, oil absorption: 1.6 mL/g) was used.

A photosensitive resin constituent for a flexographic printing plate was obtained with the other conditions set in the same manner as in [Example 1] described above.

Example 3

As the particle having a pore structure, silica of Sylysia 740 (manufactured by Fuji Silysia Chemical Ltd., average particle size: 5.0 μm, specific surface area 700 m²/g, oil absorption: 0.95 mL/g) was used.

A photosensitive resin constituent for a flexographic printing plate was obtained with the other conditions set in the same manner as in [Example 1] described above.

Example 4

As the particle having a pore structure, silica of Sylysia 770 (manufactured by Fuji Silysia Chemical Ltd., average particle size: 6.7 μm, specific surface area 700 m²/g, oil absorption: 0.95 mL/g) was used.

A photosensitive resin constituent for a flexographic printing plate was obtained with the other conditions set in the same manner as in [Example 1] described above.

Example 5

In (Production of Cover Sheet including Particle Layer and UV Blocking Layer) described in [Example 1] above, 85 parts by mass of TR2787 (manufactured by JSR Corporation, trade name) and 15 parts by mass of Sylysia 550 (manufactured by Fuji Silysia Chemical Ltd., average particle size: 3.9 μm, specific surface area 500 m²/g, oil absorption: 1.6 mL/g) were used.

A photosensitive resin constituent for a flexographic printing plate was obtained with the other conditions set in the same manner as in [Example 1] described above.

Example 6

In (Production of Cover Sheet including Particle Layer and UV Blocking Layer) described in [Example 1] above, 65 parts by mass of TR2787 (manufactured by JSR Corporation, trade name) and 35 parts by mass of Sylysia 550 (manufactured by Fuji Silysia Chemical Ltd., average particle size: 3.9 μm, specific surface area 500 m²/g, oil absorption: 1.6 mL/g) were used.

A photosensitive resin constituent for a flexographic printing plate was obtained with the other conditions set in the same manner as in [Example 1] described above.

Example 7

In (Production of Cover Sheet including Particle Layer and UV Blocking Layer) described in [Example 1] above, a thermoplastic elastomer of D1101 (manufactured by Kraton Corporation, trade name), that is, a styrene-butadiene block copolymer, having a number average molecular weight of 160,000 was used as a binder having a crosslinkable group.

A photosensitive resin constituent for a flexographic printing plate was obtained with the other conditions set in the same manner as in [Example 1] described above.

Example 8

In (Production of Cover Sheet including Particle Layer and UV Blocking Layer) described in [Example 1] above, a thermoplastic elastomer of D1161 (manufactured by Kraton Corporation, trade name), that is, a styrene-isoprene block copolymer, having a number average molecular weight of 180,000 was used as a binder having a crosslinkable group.

A photosensitive resin constituent for a flexographic printing plate was obtained with the other conditions set in the same manner as in [Example 1] described above.

Example 9

In [Production of Printing Plate for Characteristic Evaluation] described below, the photosensitive resin constituent for the flexographic printing plate obtained in [Example 1] was not irradiated with UV by using an upper lamp (UV lamp TL80W/10R manufactured by PHILIPS, trade name) but instead irradiated with UV of 8000 mJ/cm$^2$ by using an LED-UV at an illuminance of 22 mW/cm$^2$.

The illuminance was measured by using a UV luminometer, model MO-2 manufactured by ORC Manufacturing Co., Ltd. (manufactured by ORC Manufacturing Co., Ltd., trade name, UV-35 filter).

In Table 1 below, the exposure lamp was shown as "LED".

Comparative Example 1

In (Production of Cover Sheet including Particle Layer and UV Blocking Layer) described in [Example 1] above, no particle layer was applied.

A photosensitive resin constituent for a flexographic printing plate was obtained with the other conditions set in the same manner as in [Example 1] described above.

Comparative Example 2

As the particle, silica of Sylysia 250 (manufactured by Fuji Silysia Chemical Ltd., average particle size: 5.0 μm, specific surface area 280 m$^2$/g, oil absorption: 3.3 mL/g) was used.

A photosensitive resin constituent for a flexographic printing plate was obtained with the other conditions set in the same manner as in [Example 1] described above.

Comparative Example 3

As the particle, a silicone resin of Tospearl 240 (manufactured by Momentive Performance Materials Inc., average particle size: 4.0 μm, specific surface area 35 m$^2$/g, oil absorption: 0.84 mL/g) was used.

A photosensitive resin constituent for a flexographic printing plate was obtained with the other conditions set in the same manner as in [Example 1] described above.

Comparative Example 4

In (Production of Cover Sheet including Particle Layer and UV Blocking Layer) described in [Example 1] above, a polybutadiene of B3000 (manufactured by Nippon Soda Co., Ltd., trade name) having a number average molecular weight of 6,000 was used as the binder having a crosslinkable group.

In Comparative Example 4, the particle layer flowed out during the heating and compression molding described in (Production of Photosensitive Resin Constituent for Flexographic Printing Plate) described above, and hence a photosensitive resin constituent for a flexographic printing plate could not be obtained, and therefore, the evaluation of a printing plate was not performed.

Production of Printing Plate for Characteristic Evaluation

In the photosensitive resin constituent for the flexographic printing plate obtained in each of [Examples] and [Comparative Examples] described above, the polyester film alone was peeled off so as to transfer the UV blocking layer onto the particle layer, and the resultant was attached on a drum of "CDI-Spark 4260" (manufactured by Esko-Graphics, trade name) with the UV blocking layer faced outside.

With laser power set to 20 W and drum rotation speed set to 600 rpm, the UV blocking layer on the photosensitive resin constituent for the flexographic printing plate was subjected to the laser drawing to ablate a part of the UV blocking layer.

Next, on an exposure machine of "AFP-1216E" (manufactured by Asahi Kasei E-Materials Corporation, trade name), exposure was first performed at 600 mJ/cm$^2$ on the whole surface from a support side to obtain a relief depth of the printing plate of 0.6 mm by using a lower UV lamp (UV Lamp TL80W/10R manufactured by PHILIPS, trade name).

Subsequently, UV of 8000 mJ/cm$^2$ was irradiated from a UV blocking layer side by using an upper lamp (UV Lamp TL80W/10R manufactured by PHILIPS, trade name). It is noted that exposure intensity at this point was measured by using the UV luminometer, model MO-2 manufactured by ORC Manufacturing Co., Ltd. (manufactured by ORC Manufacturing Co., Ltd., trade name, UV-35 filter).

In Table 1 below, the exposure lamps used in Examples 1 to 8 and Comparative Examples 1 to 3 are shown as "10R".

Subsequently, the resultant was fixed, with a double-sided adhesive tape attached to the side subjected to the back exposure described above, on a rotating drum of "AFP-1500" developing device (manufactured by Asahi Kasei E-Materials Corporation, trade name), and development was performed with 3-methoxybutyl acetate used as a developer at a liquid temperature of 25° C. for 5 minutes, and the resultant was dried at 60° C. for 2 hours.

Thereafter, as post-exposure, exposure of 2000 mJ/cm$^2$ was performed on the whole surface of the dried photosensitive resin plate by using ALF-200 UP (manufactured by Asahi Kasei E-Materials Corporation, trade name) and by using a germicidal lamp having a center wavelength of 254 nm (manufactured by Toshiba Corp., GL-30, trade name). The amount of the post-exposure using the germicidal lamp performed here was calculated based on the illuminance measured by using a UV-25 filter of the model "UV-MO2".

Results of the evaluation test of printing plates produced using the photosensitive resin constituents for a flexographic printing plate obtained in [Example 1 to 9] and [Comparative Examples 1 to 4] described above are shown in Table 1 below.

TABLE 1

|  |  | Example 1 | Example 2 | Example 3 | Example 4 | Example 5 | Example 6 | Example 7 |
|---|---|---|---|---|---|---|---|---|
| Particle | Component | Silica | Silica | Silica | Silica | Silica | Silica | Silica |
|  | Average Particle Size ($\mu$m) | 4.1 | 3.9 | 5.0 | 6.7 | 3.9 | 3.9 | 4.1 |
|  | Specific Surface Area ($m^2/g$) | 350 | 500 | 700 | 700 | 500 | 500 | 350 |
|  | Oil Absorption (mL/g) | 2.3 | 1.6 | 0.95 | 0.95 | 1.6 | 1.6 | 2.3 |
| Amount of Particle in Whole Particle Layer (mass %) | | 25 | 25 | 25 | 25 | 15 | 35 | 25 |
| Number Average Molecular Weight of Binder having Crosslinkable Group | | 120,000 | 120,000 | 120,000 | 120,000 | 120,000 | 120,000 | 160,000 |
| Exposure Lamp | | 10R | 10R | 10R | 10R | 10R | 10R | 10R |
| Ink density before Abrasion | | 1.68 | 1.67 | 1.73 | 1.67 | 1.63 | 1.68 | 1.67 |
| Ink density after Abrasion | | 1.67 | 1.68 | 1.74 | 1.67 | 1.62 | 1.66 | 1.68 |
| Ra before Abrasion ($\mu$m) | | 0.54 | 0.43 | 0.39 | 0.59 | 0.55 | 0.52 | 0.53 |
| Rsk before Abrasion | | 1.10 | 0.79 | 1.33 | 2.52 | 0.88 | 0.67 | 0.55 |
| Rsk after Abrasion | | 0.56 | 0.86 | 1.10 | 2.00 | 0.55 | 0.52 | 0.28 |

|  |  | Example 8 | Example 9 | Comparative Example 1 | Comparative Example 2 | Comparative Example 3 | Comparative Example 4 |
|---|---|---|---|---|---|---|---|
| Particle | Component | Silica | Silica | none | Silica | Silicone Resin | Silica |
|  | Average Particle Size ($\mu$m) | 4.1 | 4.1 | none | 5.0 | 4.0 | 4.1 |
|  | Specific Surface Area ($m^2/g$) | 350 | 350 | none | 280 | 35 | 350 |
|  | Oil Absorption (mL/g) | 2.3 | 2.3 | none | 3.3 | 0.84 | 2.3 |
| Amount of Particle in Whole Particle Layer (mass %) | | 25 | 25 | none | 25 | 25 | 25 |
| Number Average Molecular Weight of Binder having Crosslinkable Group | | 180,000 | 120,000 | none | 120,000 | 120,000 | 6,000 |
| Exposure Lamp | | 10R | LED | 10R | 10R | 10R | No constituent was obtained. |
| Ink density before Abrasion | | 1.75 | 1.66 | 1.55 | 1.60 | 1.45 | |
| Ink density after Abrasion | | 1.75 | 1.66 | 1.53 | 1.50 | 1.47 | |
| Ra before Abrasion ($\mu$m) | | 0.53 | 0.51 | 0.13 | 0.51 | 0.52 | |
| Rsk before Abrasion | | 1.20 | 0.52 | −1.32 | 0.33 | −1.62 | |
| Rsk after Abrasion | | 0.66 | 1.10 | 0.32 | −1.63 | −1.62 | |

In [Examples 1 to 9], the ink density was definitely increased as compared with that in [Comparative Example 1], and it was found that the high ink density was retained after abrasion.

In [Comparative Example 2], the ink density was slightly increased as compared with that in [Comparative Example 1], but the ink density was lowered after the abrasion.

In [Comparative Example 3], the ink density was largely lowered before the abrasion, and the ink density obtained after the abrasion was also low.

The present application is based upon the prior Japanese patent application (Japanese Patent Application No. 2016-074581), filed with Japan Patent Office on Apr. 1, 2016, the entire contents of which are incorporated herein by reference.

INDUSTRIAL APPLICABILITY

A photosensitive resin constituent for a flexographic printing plate of the present invention is industrially applicable as a photosensitive resin constituent to be used in a flexographic printing plate.

The invention claimed is:

1. A photosensitive resin constituent for a flexographic printing plate, comprising at least a support, a photosensitive resin composition layer, and a particle layer, wherein
   the photosensitive resin composition layer contains a photosensitive resin composition containing a binder, a monomer, and a polymerization initiator,
   the particle layer contains a resin composition containing a binder having a crosslinkable group and a particle having a pore structure, and
   the particle having a pore structure has an average particle size of 1 $\mu$m or more and 10 $\mu$m or less, and a specific surface area of 350 $m^2/g$ or more and 1000 $m^2/g$ or less, and
   comprising, on the particle layer, an infrared laser-ablative UV blocking layer containing an infrared sensitive substance.

2. The photosensitive resin constituent for the flexographic printing plate according to claim 1, wherein the particle having a pore structure is an inorganic oxide.

3. The photosensitive resin constituent for the flexographic printing plate according to claim 1, wherein the particle having a pore structure is silica.

4. The photosensitive resin constituent for the flexographic printing plate according to claim 1, wherein the binder having a crosslinkable group is an elastomer having a number average molecular weight of 50,000 or more and 300,000 or less.

5. The photosensitive resin constituent for the flexographic printing plate according to claim 1,
   wherein a content of the particle having a pore structure is 10% by mass or more and 50% by mass or less of the particle layer.

6. The photosensitive resin constituent for the flexographic printing plate according to claim 1,
wherein the particle having a pore structure has oil absorption of 0.5 mL/g or more and 3.0 mL/g or less.

* * * * *